(12) United States Patent
Wu

(10) Patent No.: US 9,825,607 B2
(45) Date of Patent: Nov. 21, 2017

(54) PHASE-SHIFTING UNIT MODULE, MANUFACTURING METHOD THEREFOR, PHASE-SHIFTING DEVICE, AND ANTENNA

(71) Applicant: GUANGDONG BROADRADIO COMMUNICATION TECHNOLOGY CO., LTD, Guangzhou (CN)

(72) Inventor: Biqun Wu, Guangzhou (CN)

(73) Assignee: GUANGDONG BROADRADIO COMMUNICATION TECHNOLOGY CO., LTD., Guangzhou (CN)

( * ) Notice: Subject to any disclaimer, the term of this patent is extended or adjusted under 35 U.S.C. 154(b) by 473 days.

(21) Appl. No.: 14/396,741

(22) PCT Filed: Nov. 4, 2013

(86) PCT No.: PCT/CN2013/086481
§ 371 (c)(1),
(2) Date: Oct. 23, 2014

(87) PCT Pub. No.: WO2014/094509
PCT Pub. Date: Jun. 26, 2014

(65) Prior Publication Data
US 2015/0116180 A1    Apr. 30, 2015

(30) Foreign Application Priority Data

Dec. 17, 2012   (CN) .......................... 2012 1 0546668
Oct. 30, 2013   (CN) .......................... 2013 1 0526853

(51) Int. Cl.
*H03H 7/20*     (2006.01)
*H01P 1/18*     (2006.01)
(Continued)

(52) U.S. Cl.
CPC .............. *H03H 7/20* (2013.01); *H01P 1/184* (2013.01); *H01Q 1/50* (2013.01); *H01Q 3/32* (2013.01);
(Continued)

(58) Field of Classification Search
CPC . H03H 7/20; H01P 1/184; H01Q 1/50; H01Q 3/32; H01Q 1/246; Y10T 29/49016
(Continued)

(56) References Cited

U.S. PATENT DOCUMENTS

| 5,949,303 A * | 9/1999 | Arvidsson | ................ H01Q 3/32 333/136 |
| 2014/0218130 A1* | 8/2014 | Lecam | ..................... H01Q 3/32 333/136 |

FOREIGN PATENT DOCUMENTS

| CN | 1547788 A | 11/2004 |
| CN | 201430200 Y | 3/2010 |

(Continued)

*Primary Examiner* — Dameon E Levi
*Assistant Examiner* — David Lotter
(74) *Attorney, Agent, or Firm* — Gokalp Bayramoglu

(57) ABSTRACT

The present invention relates to a phase-shifting unit module, a manufacturing method therefor, a phase shifting device, and an antenna. The phase-shifting unit module comprises a first metal ground plate, a second metal ground plate, an insulating dielectric plate, a slide apparatus, and a fixed transmission line. The insulating dielectric plate is provided thereon with at least one impedance transforming part. The thickness of the impedance transforming part is less than the thickness of the remaining parts of the insulating dielectric plate. The impedance transforming part of the insulating dielectric plate is overlapped with the fixed transmission line during a moving process. The insulating dielectric plate is overlapped only with the fixed transmission line, thus reducing reflected signals, while at the same
(Continued)

time reducing losses, and facilitating ultra-wideband design of the phase-shift unit module and of the phase-shifting device.

15 Claims, 4 Drawing Sheets

(51) Int. Cl.
*H01Q 1/50* (2006.01)
*H01Q 3/32* (2006.01)
*H01Q 1/24* (2006.01)

(52) U.S. Cl.
CPC ........ *H01Q 1/246* (2013.01); *Y10T 29/49016* (2015.01)

(58) Field of Classification Search
USPC ......................................................... 343/852
See application file for complete search history.

(56) References Cited

FOREIGN PATENT DOCUMENTS

| | | |
|---|---|---|
| CN | 20169910 U | 5/2011 |
| CN | 102544733 A | 7/2012 |
| CN | 103050764 A | 4/2013 |
| CN | 203071212 U | 7/2013 |
| WO | WO03019723 A1 | 3/2003 |

\* cited by examiner

PHASE-SHIFTING UNIT MODULE, MANUFACTURING METHOD THEREFOR, PHASE-SHIFTING DEVICE, AND ANTENNA

TECHNICAL FIELD

The present application relates to the technical field of antenna for base station, and particularly to a phase-shifting unit module, a manufacturing method therefor, a phase-shifting device and an antenna.

BACKGROUND

A traditional tunable antenna element consists of a power splitter, a transformer and a phase adjuster. In high performance antennas, these components are in close association with each other, since these components over-strain strongly interacts with each other, it is sometimes difficult to form a desired beam shape, thus requiring specification phase shifting device to address these problems.

In a first prior art, in the U.S. Pat. No. 5,949,303, a network for adjusting the beam direction of a beam radiated from a stationary array of antenna is disclosed. The beam forming network includes a fixed substrate, a fixed carrying plate accompanied with a feeder line network and movable insulating plate. The insulating plate is placed between the fixed substrate and the fixed carrying plate, so as to achieve phase shifting functions by moving the insulator. The technology has the following disadvantages: first, the insulating plate is overlapped with the plurality of feeder, which increases the loss; second, the insulating plate intersects with multiple locations on the feeder line network, which increases the reflective signal and is disadvantageous for the design of wide-band; third, the arrangement order of the output end conflicts with that of the radiating unit of the linear antenna array, which increases the complexity of connection between the output end and the radiating unit and also increases the length of connecting cable between the output and the radiating element, increasing costs and loss; fourth, this method is not applicable to a linear antenna array having odd output ports.

In a second prior art, in a European patent WO 03/019723, an antenna feeding network with an integrated phase shifter is disclosed. The device includes a branch network of common feeder line with multiple ports, and a dielectric plate mounted adjacent to the network. The dielectric plate is movable so as to synchronously adjust the phase relationship between the common feeder line and one or more ports. The technology has the following disadvantages: first, the device employs a monolith elongated dielectric plate which is prone to deform, thus affecting the stability of the overall device performance; second, the elongated dielectric plate is in contact with feeder line in a bigger area, a large friction is generated between the dielectric plate and the feeder line during moving, which causes the feeder circuit to be worn, resulting in an unstable third order intermodulation of the device; third, the dielectric plate intersects with multiple feeder lines, which increases the reflected signals and is disadvantageous for the design of wide-band; Fourth, the dielectric plate is overlapped with the multiple feeder line, which increases the loss.

FIG. 1 is a drawing of a ten-ports device of an embodiment provided by the second prior art, wherein a stripline 18 is located between an insulator 47a and an insulator 47b. When the insulator 47a and the insulator 47b synchronously moves towards the same direction, the differences between the individual adjacent ports are synchronously changed, and the biggest phase difference is determined by the distance of moving of the insulator 47a, 47b, that is determined by the length of the stripline 18. The phase difference between the adjacent output ports is in proportion to the downtilt angle of the antenna array. The stripline 18 is of a straight line shape and is applicable to an antenna array with a small downtilt angle (for example a downtilt angle of 10 degree). If the device is used in an antenna array with a large downtilt angle (for example greater than a downtilt angle of 15 degree), it needs to increase significantly the length of the stripline 18, so that the overall length of the device is far greater than the length of the antenna array, increasing the length, the cost and the complexity of the antenna. Correspondingly, the length of the insulator 47a, 47b needs to be greatly increased. Since the insulator 47a, 47b generally is formed of plastic, if the length is too long, the insulator 47a, 47b easily deformed, which affects the stability of the overall performance of the device. Additionally, the insulator 47a, 47b greatly covers the stripline 18 and the power divider, increasing the loss of the device.

In view of above, the phase-shifting device in prior art has limited application, and is not applicable in the antenna array with a large downtilt. The area of the insulator in the device is relative large, which increases the manufacturing accuracy, difficulty and cost of the insulator, and the insulator is easily deformed, the insulator overlaps with the most of the feeder line, increasing the loss.

SUMMARY

The object of the present application is to provide a phase-shifting unit module, a manufacturing method therefor, a phase-shifting device and an antenna, which reduces unnecessary loss caused by the insulating dielectric plate, while reducing the manufacturing difficulty and cost of the insulating dielectric plate and increasing the applicability of the phase-shifting unit module and phase-shifting device in an antenna array with a large downtilt angle.

In order to achieve the above objects, the present application uses the following technical solution:

a phase-shifting unit module, including a first metal ground plate, a second metal ground plate, an insulating dielectric plate, a slide device and a fixed transmission line; the fixed transmission line and the insulating dielectric plate are sandwiched between the first metal ground plate and the second metal ground plate; the insulating dielectric plate is provided on a side of the fixed transmission line, is fixed on the slide device and is moved on the side of the fixed transmission line by the slide device;

at least one impedance transforming part is provided on the insulating dielectric plate; the thickness of the impedance transforming part is smaller than that of other part of the insulating dielectric plate;

the impedance transforming part of the insulating dielectric plate is overlapped with the fixed transmission line during moving.

Preferably, there are provided two insulating dielectric plates which are provided on two opposite sides of the fixed transmission line, respectively; the two insulating dielectric plates are both fixed on the same slide device and are synchronously moved on the two sides of the fixed transmission line by the slide device.

Preferably, the impedance transforming part is formed by removing a part of material in the direction of thickness on a local region on the insulating dielectric plate.

Preferably, the fixed transmission line at least comprises a segment of straight transmission line.

Preferably, the fixed transmission line is a zigzag transmission line formed by connecting in order several straight transmission lines, the zigzag transmission line comprises several straight transmission lines and connecting transmission lines; the several straight transmission lines are arranged to be parallel to each other and extends along the moving direction of the insulating dielectric plate; the several straight transmission lines are connected end to end in order via the connecting transmission lines.

Preferably, there are provided several impedance transforming parts, and the thicknesses of the impedance transforming parts are different from each other.

A phase-shifting device, including a plurality of phase-shifting unit modules according to above, the plurality of phase-shifting unit modules are distributed on the same plane, the fixed transmission lines of the individual phase-shifting unit modules are electrically connected to each other via several power dividers the insulating dielectric plate of the plurality of phase-shifting unit modules are fixed on the same slide device, and are synchronously moved by the slide device.

Preferably, the first metal ground plates of the plurality of phase-shifting unit modules are formed into one piece, the second metal ground plates of the plurality of phase-shifting unit modules are formed into one piece, the fixed transmission line and the power divider are etched on the same PCB substrate, the insulating dielectric plate provided on the side of the fixed transmission line are provided on a side of the PCB substrate.

Preferably, a limiting slide slot is provided on the first metal ground plate and the PCB substrate, the slide device passes through the limiting slide slot of the first metal ground plate and the PCB substrate in order from the outside, and is fixedly connected to the insulating dielectric plate on the side of the fixed transmission line for driving the plurality of insulating dielectric plate to synchronously move on the side of the respective fixed transmission line, the provision of the limiting sliding slot causes the insulating dielectric plate to be overlapped with only the fixed transmission line on the PCB substrate during moving.

Preferably, the slide device includes a pull rod, a pull rod guide rail and a plurality of plug pins, the pull rod guide rail is fixed on a side of the first metal ground plate that faces away from the PCB substrate, the pull rod is slidably mounted on the pull rod guide rail; one end of the plug pin is fixed on the pull rod and the other end passes through the limiting slide slot on the first metal ground plate and the PCB substrate in order and is fixedly connected to the insulating dielectric plate distributed on the side of the PCB substrate.

Preferably, low-loss microwave dielectric material is filled between the power divider and the first metal ground plate and the second metal ground plate.

A method for manufacturing a phase-shifting unit module, comprising:

forming an impedance transforming part by removing a part of material in the direction of thickness on a local region on an insulating dielectric plate for the phase-shifting unit module, the thickness of the impedance transforming part being smaller than that of the rest part of the insulating dielectric plate.

Preferably, the method further comprises:
sandwiching a fixed transmission line between two insulating dielectric plates;
sandwiching the insulating dielectric plate and the fixed transmission line between two metal ground plates;

fixedly connecting the two insulating dielectric plates to the same slide device to achieve synchronous moving on two sides of the fixed transmission line.

Preferably, the method further comprises:
providing an insulating dielectric plate on one side of the fixed transmission line;
sandwiching the insulating dielectric plate and the fixed transmission between the two metal ground plates;
fixedly connecting the insulating dielectric plate to a slide device to achieve synchronous moving on the side of the fixed transmission line.

Preferably, the method further comprises forming a plurality of impedance transforming parts by removing a part of material in the direction of thickness on a plurality of local regions on the insulating dielectric plate, the thicknesses of the plurality of impedance transforming part being different from each other.

An antenna, comprising a phase-shifting device according to above and several signal radiating units connected to the phase-shifting device.

With the phase-shifting unit module, the manufacturing method therefor, the phase shifting device and the antenna, the monolithic insulator on the feeder line network is divided into multiple smaller insulating dielectric plates, the insulating dielectric plate is only provided at the corresponding positions on the fixed transmission line, and all of the insulating dielectric plates are controlled to synchronously move by one slide device. The insulating dielectric plate does not overlap with the power divider during moving, it is avoided that the insulating dielectric sheet causes excessive loss and signal reflection to the feeder line network. Also, a monolithic large insulator design is replaced by the multiple small insulating dielectric plates, thus solving the problems that the insulator is easily deformed, decreasing the manufacturing cost of the phase-shifting device, increasing applicability of the phase-shifting unit module and the phase-shifting device in the large down-tilt antenna array. The insulating dielectric plate in the present invention only overlaps with the fixed transmission line, which reduces the reflection signals, while decreasing losses, and facilitates the design of ultra-wideband of the phase-shifting unit module and the phase-shifting device.

DETAILED DESCRIPTION

Hereinafter, the present application will be further described in detail in conjunction with drawings and specific embodiments.

For convenience only, in the following description, the use of specific directional terms, such as "up", "down", "left", "right", etc. are referred to corresponding drawings, and does not intend to limit the present application, when the defined directions in drawing are changed, the directions indicated by this terms should be interpreted as different directions.

First Embodiment

Figure 1:
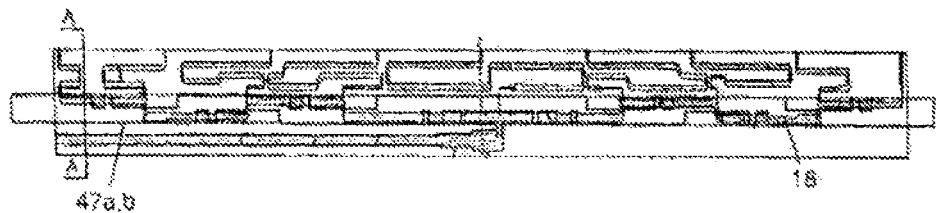
FIG. 1 is a structural schematic drawing of a ten-ports device of the prior art II.
Figure 2:
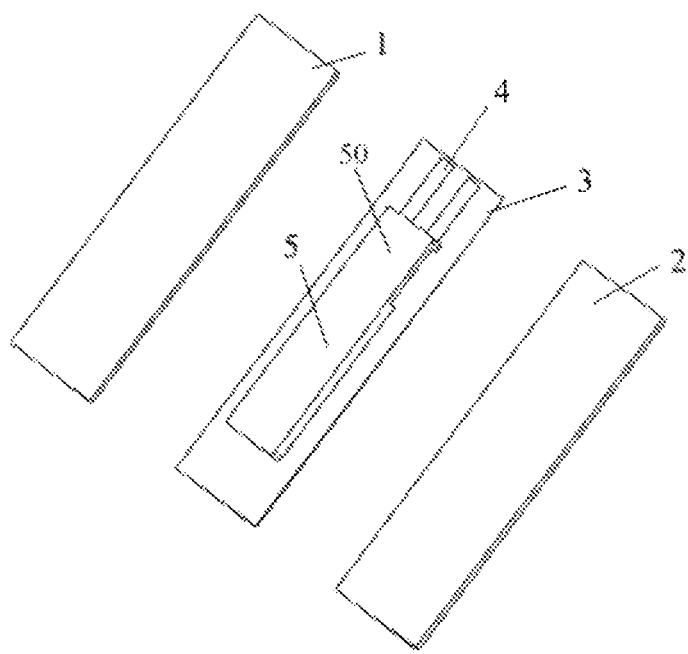
FIG. 2 is a structural schematic drawing of a phase-shifting unit module of a first embodiment according to the present application.
Figure 3:
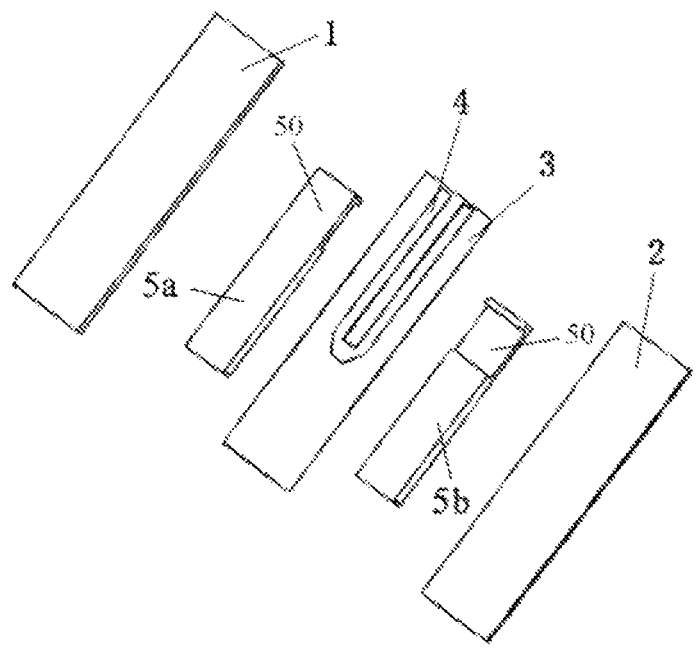
FIG. 3 is an exploded structural schematic drawing of the phase-shifting unit module of the first embodiment according to the present application.

Referring to FIGS. 2 and 3, a phase-shifting unit module provided by the embodiment according to the present application includes a first metal ground plate 1, a second metal ground plate 2, a fixed transmission line 4 and an insulating dielectric plate 5. There are provided two insulating dielectric plates 5, i.e. a first insulating dielectric plate 5a and a second insulating dielectric plate 5b which are provided on an upper side and a lower side of the fixed transmission line 4, respectively. The fixed transmission line 4 and the insulating dielectric plate 5 are sandwiched between the first metal ground plate 1 and a second metal ground plate 2. The two insulating dielectric plates 5 are both fixed on one slide device (not shown), and can be moved by the slide device on two sides of the fixed transmission line 4. It should be noted that it is also possible to use only one insulating dielectric plate 5, which is provided at one side of the fixed transmission line 4. The structure of two insulating dielectric plate 5 used in the embodiment of the present application is a preferable embodiment.

In the embodiment according to the present application, the fixed transmission line 4 is embodied as a stripline structure. Specifically, the fixed transmission line 4 is a zigzag transmission line formed by connecting multiple straight transmission lines, which has a "U"-shaped structure. The zigzag transmission line includes multiple straight transmission lines and connecting transmission lines; the multiple straight transmission lines are arranged in parallel to each other and extend in a direction in which the insulating dielectric plate is moved. The multiple straight transmission lines are connected end to end in order by the connecting transmission line, wherein the connecting transmission line can be straight or curved. The fixed transmission line 4 can be formed on conductor sheet material by cutting or stamping or can be printed on a PCB substrate. In an embodiment of the present application, the fixed transmission line 4 is printed on an FR4 dielectric substrate 3 having the thickness of 0.2 mm.

Figure 4:
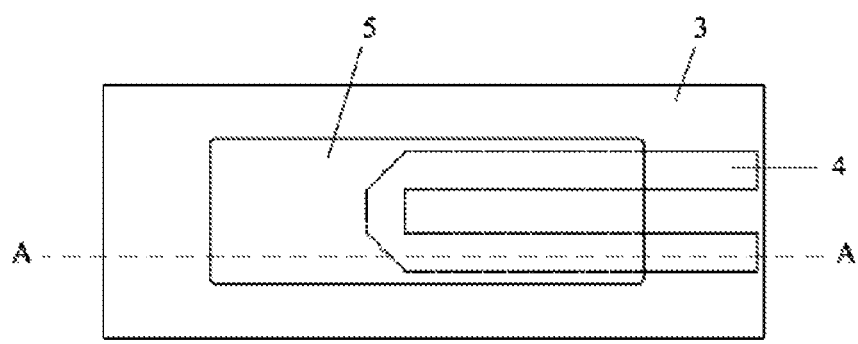
FIG. 4 is a top view of an internal structure of the phase-shifting unit module of the first embodiment according to the present application.
Figure 5:
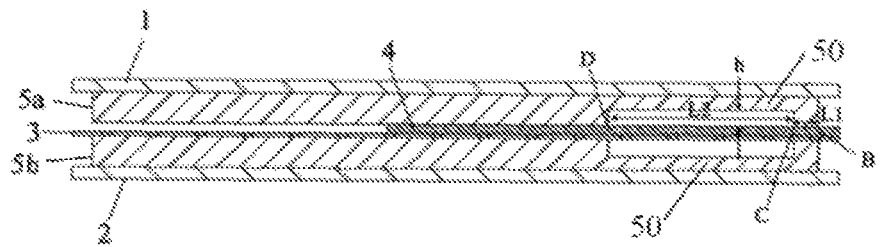
FIG. 5 is a sectional view of a part A-A in FIG. 4.

FIG. 4 shows a top view of an inner structure of the embodiment, with the first metal ground plate 1 being removed. The position of the projection of the first insulating dielectric plate 5a is overlapped with that of the second insulating dielectric plate 5b on the dielectric substrate 3; the insulating dielectric plate 5 covers a part of the fixed transmission line 4, in other words, the insulating dielectric plate 5 is overlapped with the fixed transmission line 4. FIG. 5 shows a sectional view of an A-A part in FIG. 4. The first insulating dielectric plate 5a and the second insulating dielectric plate 5b have rectangle-like shapes, each of the first insulating dielectric plate 5a and the second insulating dielectric plate 5b is provided with an impedance transforming part 50 on positions close to the right end. The thickness of the impedance transforming part 50 is smaller than that of the rest part on the insulating dielectric plate 5. During the two insulating dielectric plate 5 moves with the slide device, the impedance transforming part 50 is overlapped with the fixed transmission line 4.

As shown in FIG. 5, the impedance transforming part 50 is formed by removing a part of material in the direction of the thickness on a local region on the insulating dielectric plate 5, thus the insulating dielectric plate 5 has a concave stepped structure.

It is noted that the part formed by removing material of the impedance transforming part 50 can be located at either an upper bottom surface of the insulating dielectric plate 5 or a lower bottom surface of the insulating dielectric plate 5, or the part can be formed by removing the material in the direction of thickness on the two sides of the insulating dielectric plate 5 at the same time; in the embodiment of the present application, the distance from the impedance transforming part 50 to a right end B of the insulating dielectric plate 5 is L1, the material removed has a length of L2 and a thickness of h. After removing a part of material what is filled on or below parts C to D of the fixed transforming cable 4 is a mixture of air and insulating medium, and the impedance of the parts C to D of the fixed transforming cable 4 can be regulated by regulating the thickness h of the material removed. By regulating the values of the parameters h, L1, L2 by using a high-frequency simulation software, it is possible to reduce the reflection of signal, in other words, it is possible to reduce the reflection of signal flowing from B to D, and also possible to reduce the reflection of signal flowing from D to B.

Specifically, when the two insulating dielectric plates 5 slide synchronously rightwards on both sides of the fixed transmission line 4 via the slide device, the variation of electric length between two ends of the fixed transmission line 4 is:

$$\Delta l = \frac{2L}{\lambda}(\sqrt{\varepsilon_r} - \sqrt{\varepsilon_0})$$

wherein L is the distance by which the insulating dielectric plate 5 is moved, λ is the working wave-length in air, ∈r is the dielectric constant of the insulating dielectric plate 5, ∈0 is 1 which is the dielectric constant of air; then the phase difference caused by the change of the electric length is:

$$\Delta\theta = \frac{2L}{\lambda}(\sqrt{\varepsilon_r} - 1)*2\pi$$

Hence, when the insulating dielectric plate 5 slides on the fixed transmission line 4, the distance of slide L changes, with which the phase difference changes, thus the phase is shifted.

As an improvement, multiple impedance transforming parts 50 can be provided on the insulating dielectric plate 5. The multiple impedance transforming parts 50 can be distributed adjacent to each other or can be distributed to be spaced from each other as desire, and the value of the thicknesses of the individual impedance transforming parts 50 can be set to be the same or different. With such improvement, it is possible to generate a better impedance transforming effect on the fixed transmission line 4 by the insulating dielectric plate 5, so as to satisfy the requirement on the design of ultra-wideband of the phase-shifting unit module.

Second Embodiment

In a present embodiment according to the present application, multiple phase-shifting unit modules according to the first embodiment are assembled together to form a more complex phase-shifting device. Specifically, multiple phase-shifting unit modules are distributed on the same plane, the fixed transforming cables 4 of the individual phase-shifting unit module are electrically connected to each other via several power dividers 6. The first metal ground plate 1 of the multiple phase-shifting unit modules are integrally formed, and the second metal ground plate 2 of the multiple phase-shifting unit modules are integrally formed. The insulating dielectric plate 5 of the multiple phase-shifting unit modules are fixed on the same slide device and is synchronously moved by the slide device.

Figure 6:
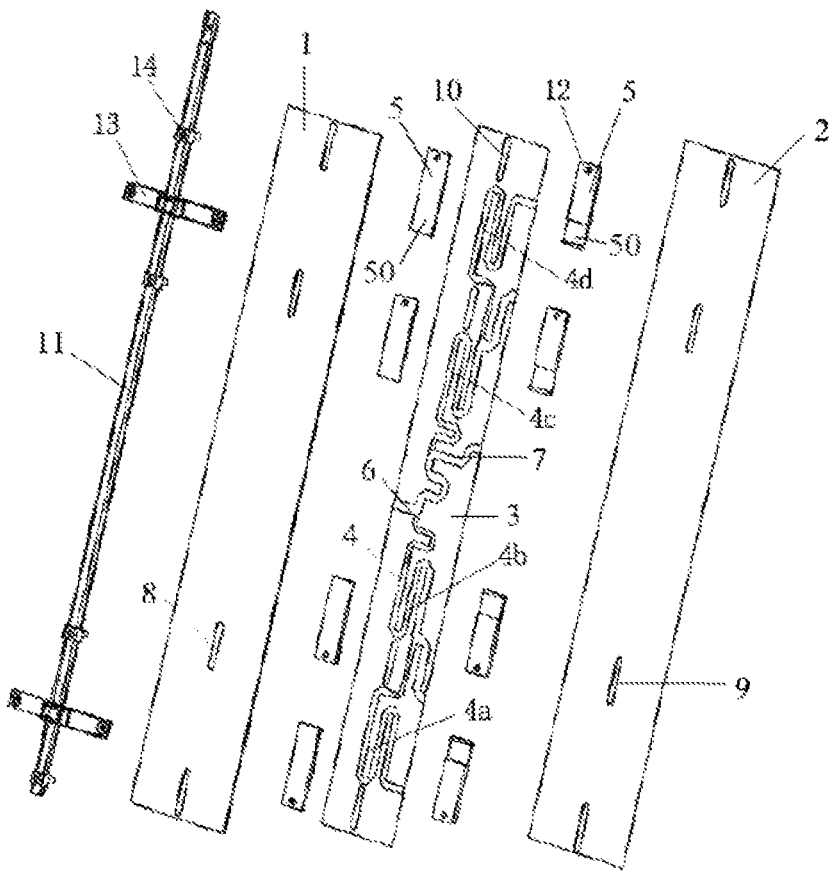
FIG. 6 is an exploded structural schematic drawing of the phase-shifting unit module of the second embodiment according to the present application.
Figure 7:
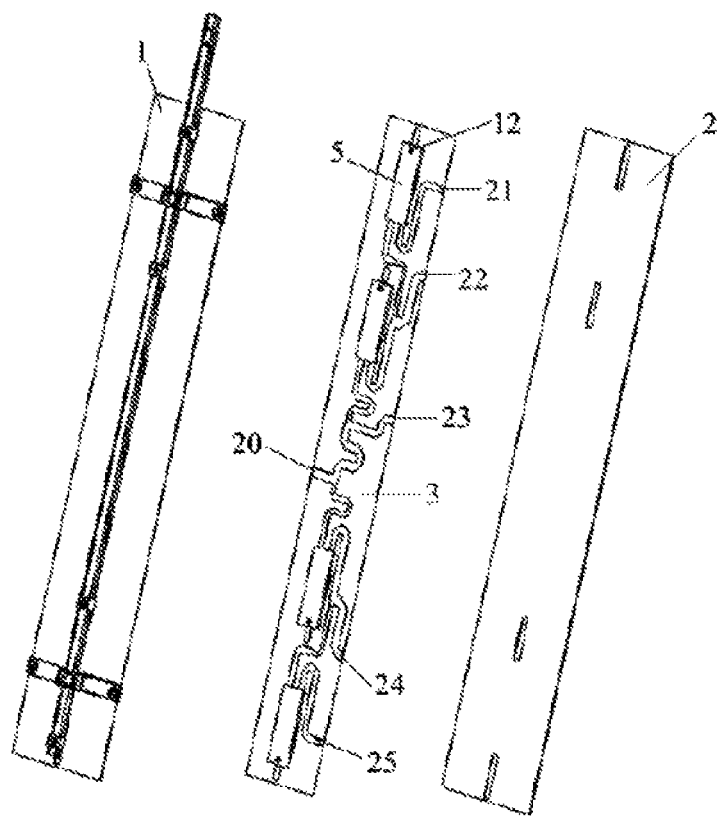
FIG. 7 is an assembling schematic drawing of the phase-shifting unit module of the second embodiment according to the present application.

As shown in FIGS. 6 and 7, a phase-shifting device provided by the embodiment according to the present application includes a first metal ground plate 1, a second metal ground plate 2, a fixed transmission line 4, a power divider 6, an insulating dielectric plate 5 and a slide device. The fixed transmission line 4 and the power divider 6 are printed on the same FR4 dielectric substrate 3 having the thickness of 0.2 mm. The fixed transmission line 4 is electrically connected to the power divider 6 to form a feeder network 7. The insulating dielectric plates 5 are symmetrically distributed on an upper bottom surface and a lower bottom surface of the dielectric substrate 3, the dielectric substrate 3 and the insulating dielectric plates 5 are sandwiched between the first metal ground plate 1 and the second metal ground plate 2.

In order to fix the dielectric substrate 3 and maintain it to be flat, low-loss microwave dielectric material (not shown) can be filled between the power divider 6 and the first metal ground plate 1 and the second metal ground plate 2, there is no overlap between the low-loss microwave dielectric material and the insulating dielectric plates 5.

In the embodiment according to the present application, the slide device includes a pull rod 11, two pull rod guide rails 13 and four plug pins mounted on the pull rod 11. The pull rod guide rail 13 is fixed on an upper bottom surface of the first metal ground plate 1, that is a surface facing away from the dielectric substrate 3. The pull rod 11 is slidably mounted on the two pull rod guide rails 13, and can slide along the length of the dielectric substrate 3 under guiding of the pull rod guide rail. One end of the plug pin 14 is fixed on the pull rod 11, and the other end is fixedly connected to the insulating dielectric plate 5 at a corresponding position.

Specifically, multiple limiting slide slots 8 are provided on the first metal ground plate 1, and limiting slide slots 10 are correspondingly provided at the same positions on the dielectric substrate 3. Multiple limiting slide slots 9 are provided on the second metal ground plate 2 at the same positions, and polygonal positioning slots 12 are provided at the corresponding positions on the dielectric substrate 5. The plug pin 14 passes through the limiting slide slot 8 on the first metal ground plate 1, the limiting slide slot 10 on the dielectric substrate 3 and the limiting slide slot 9 on the second metal ground plate 2 in order, while passes through the positioning slot 12 on the dielectric substrate 5 and is fixedly connected to the insulating dielectric plate 5.

As an improvement, the limiting slide slot 8 on the first metal ground plate 1, the limiting slide slot 10 on the dielectric substrate 3 and the limiting slide slot 9 on the second metal ground plate 2 are made to have an ovaloid shape for insertion and moving of the plug pin 14. The corresponding limiting slide slot 8, 10, or 9 are provided on each of the first metal ground plate 1, the dielectric substrate 3 and the second metal ground 2 for each plug pin 14. The limiting slide slots 8, 10, and 9 are used for limiting the scope of moving of the pull rod 11 for control moving limitation positions of the insulating dielectric plate 5.

When the pull rod 11 moves under a force, the insulating dielectric plate 5 is synchronously moved with the pull rod 11 and the plug pin 14. Between the limitation positions limited by the limiting slide slots 8, 10, and 9, the pull rod 11 and the plug pin 14 drive the multiple insulating dielectric plate 5 to move on the side of the respective fixed transmission line 4. The phase of signals at the two ends of the insulating dielectric plate 5 can be changed by changing corresponding positions of the insulating dielectric plate 5 and the fixed transmission line 4, so as to shift the phase. By the provision of the limiting slide slots 8, 10, and 9, the insulating dielectric plate 5 can be overlapped with only the fixed transmission line 4 on the dielectric substrate 3, and is not overlapped with the power divider 6.

As shown in FIGS. 6 and 7, when signals are feed to the phase-shifting device provided by the embodiment according to the present application, the signal is input from an input port 20, and is output through output ports 21, 22, 23, 24, 25. When all of the insulating dielectric plates 5 moves towards the above of the dielectric substrate 3 with the pull rod 11, the variation of variable delay signal between two ends of a first fixed transmission line 4a, a second fixed transmission line 4b is equal to that of variable leading signal between two ends of a third fixed transmission line 4c, a fourth fixed transmission line 4d, that is to say, when the signal passes through the first fixed transmission line 4a or the second fixed transmission line 4b, the phase variations of $-\Delta\theta$ may be generated, respectively, and when the signal passes through the third fixed transmission line 4c or the fourth fixed transmission line 4d, the phase variations of $+\Delta\theta$ may be generated, respectively.

Hence, when the transmission signal from the input port 20 to the output port 21 passes through the third fixed transmission line 4c or the fourth fixed transmission line 4d in order, the generated phase variation is $+2\Delta\theta$.

When the transmission signal from the input port 20 to the output port 22 passes through the third fixed transmission line 4c, the generated phase variation is $+\Delta\theta$.

When the transmission signal from the input port 20 to the output port 23 dose not pass through the fixed transmission line 5, the generated phase variation is 0.

When the transmission signal from the input port 20 to the output port 24 passes through the second fixed transmission line 4b, the generated phase variation is $-\Delta\theta$.

When the transmission signal from the input port 20 to the output port 25 passes through the second fixed transmission line 4b or the first fixed transmission line 4a in order, the generated phase variation is $-2\Delta\theta$.

Correspondingly, when the output ports 21, 22, 23, 24, 25 of the phase-shifting device of the embodiment according to the present application are each connected to a signal radiating unit (not shown), the insulating dielectric plates 5 are synchronously moved by the pull rod 11, the phase of the input signal of the corresponding signal radiating unit linearly changes, so as to achieve the function of downtilt of the directional drawing of the antenna.

Third Embodiment

The embodiment according to the present application provides a method for manufacturing a phase-shifting unit module according to the first embodiment, which includes the following steps:

forming an impedance transforming part by removing a part of material in the direction of thickness on a local region on an insulating dielectric plate for the phase-shifting unit module, the thickness of the impedance transforming part being smaller than that of the rest part of the insulating dielectric plate; the impedance transforming part being polygonal;

sandwiching a fixed transmission line between two insulating dielectric plates; wherein the side of the part formed by removing material is arranged towards the fixed transmission line;

sandwiching the insulating dielectric plate and the fixed transmission line between two metal ground plates:

fixedly connecting the two insulating dielectric plates to the same slide device to achieve synchronous moving on two sides of the fixed transmission line.

As an improvement, a plurality of impedance transforming parts can be formed by removing a part of material in the direction of thickness on a plurality of local regions on the insulating dielectric plate, the thicknesses of the plurality of impedance transforming part being different from each other.

Above embodiments are merely preferable embodiments illustrating the present application, which are described specifically and in detail, however, it cannot be illustrated as limitation to the scope of protection of the present application. It is noted that for those skilled in the art, it is possible to make several variations and improvements without departing from the concept of the present application, which variations and improvements all fall into the scope or protection according to the present application. Hence, the scope of protection of the present application should be interpreted to the appended claim.

What is claimed is:

1. A phase-shifting unit module, comprising a first metal ground plate, a second metal ground plate, an insulating dielectric plate, a slide device and a fixed transmission line; the fixed transmission line and the insulating dielectric plate are sandwiched between the first metal ground plate and the second metal ground plate; the insulating dielectric plate is provided on a side of the fixed transmission line, is fixed on the slide device and is moved on the side of the fixed transmission line by the slide device:

at least one impedance transforming part is provided in the insulating dielectric plate; a thickness of the impedance transforming part in a direction perpendicular to the insulating dielectric plate is smaller than that of other part of the insulating dielectric plate, the impedance transforming part is formed by removing a part of material from the insulating dielectric plate in the direction perpendicular to the insulating dielectric plate, so that the insulating dielectric plate has a concave stepped structure;

the impedance transforming part in the insulating dielectric plate is overlapped with the fixed transmission line during moving.

2. The phase-shifting unit module according to claim 1, wherein there are two insulating dielectric plates which are provided on two opposite sides of the fixed transmission line, respectively; the two insulating dielectric plates are both fixed on the same slide device and are synchronously moved on the two sides of the fixed transmission line by the slide device.

3. The phase-shifting unit module according to claim 1, wherein the fixed transmission line at least comprises a segment of straight transmission line.

4. The phase-shifting unit module according to claim 1, wherein the fixed transmission line is a zigzag transmission line formed by connecting in order a plurality of straight transmission lines, the zigzag transmission line comprises a plurality of straight transmission lines and connecting transmission lines; the plurality of straight transmission lines are arranged to be parallel to each other and extends along the moving direction of the insulating dielectric plate; the several straight transmission lines are connected end to end in order via the connecting transmission lines.

5. The phase-shifting unit module according to claim 1, wherein there are provided several impedance transforming parts, and a thicknesses in the direction perpendicular to the insulating dielectric plate of the impedance transforming parts are different from each other.

6. A phase-shifting device, comprising a plurality of phase-shifting unit modules according to claim 1, the plurality of phase-shifting unit modules are distributed on the same plane, the fixed transmission lines of the individual phase-shifting unit modules are electrically connected to each other via several power dividers; the insulating dielectric plates of the phase-shifting unit modules are fixed on the same slide device, and are synchronously moved by the slide device.

7. The phase-shifting device according to claim 6, wherein the first metal ground plates of the plurality of phase-shifting unit module are formed into one piece, the second metal ground plates of the plurality of phase-shifting unit modules are formed into one piece, the fixed transmission line and the power divider are etched on the same PCB substrate, the insulating dielectric plate provided on the side of the fixed transmission line are provided on a side of the PCB substrate.

8. The phase-shifting device according to claim 7, wherein a limiting slide slot is provided on the first metal ground plate and the PCB substrate, the slide device passes through the limiting slide slot of the first metal ground plate and the PCB substrate in order from the outside, and is fixedly connected to the insulating dielectric plate on the side of the fixed transmission line for driving the plurality of insulating dielectric plates to synchronously move on the side of the respective fixed transmission line, the provision of the limiting sliding slot causes the insulating dielectric plate to be overlapped with only the fixed transmission line on the PCB substrate during moving.

9. The phase-shifting device according to claim 8, wherein the slide device comprises a pull rod, a pull rod guide rail and a plurality of plug pins, the pull rod guide rail is fixed on a side of the first metal ground plate that faces away from the PCB substrate, the pull rod is slidably mounted on the pull rod guide rail; one end of the plug pin is fixed on the pull rod and the other end passes through the limiting slide slot on the first metal ground plate and the PCB substrate in order and is fixedly connected to the insulating dielectric plate distributed on the side of the PCB substrate.

10. The phase-shifting device according to claim 8, wherein low-loss microwave dielectric material is filled between the power divider and the first metal ground plate and the second metal ground plate.

11. A method for manufacturing a phase-shifting unit module, comprising:

forming an impedance transforming part by removing a part of material from an insulating dielectric plate for the phase-shifting unit module, so that the insulating dielectric plate has a concave stepped structure, a thickness of the impedance transforming part in a direction perpendicular to an insulating dielectric plate being smaller than that of the rest part of the insulating dielectric plate.

12. The method according to claim 11, further comprising:
   sandwiching a fixed transmission line between two insulating dielectric plates;
   sandwiching the insulating dielectric plate and the fixed transmission line between two metal ground plates;
   fixedly connecting the two insulating dielectric plates to the same slide device to achieve synchronous moving on two sides of the fixed transmission line.

13. The method according to claim 11, further comprising:
   providing an insulating dielectric plate on one side of the fixed transmission line;
   sandwiching the insulating dielectric plate and the fixed transmission line between the two metal ground plates;
   fixedly connecting the insulating dielectric plate to a slide device to achieve synchronous moving on the side of the fixed transmission line.

14. The method according to claim 11, further comprising forming a plurality of impedance transforming parts by removing a part of material in the direction perpendicular to the insulating dielectric plate on the insulating dielectric plate, the thicknesses of the plurality of impedance transforming part being different from each other.

15. An antenna, comprising a phase-shifting device according to claim 6 and several signal radiating units connected to the phase-shifting device.

* * * * *